US006373088B2

United States Patent
Kwok et al.

(10) Patent No.: US 6,373,088 B2
(45) Date of Patent: *Apr. 16, 2002

(54) EDGE STRESS REDUCTION BY NONCOINCIDENT LAYERS

(75) Inventors: Siang Ping Kwok, Dallas; William F. Richardson, Richardson; Dirk N. Anderson, Plano, all of TX (US)

(73) Assignee: Texas Instruments Incorporated, Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/096,012

(22) Filed: Jun. 10, 1998

Related U.S. Application Data

(60) Provisional application No. 60/049,765, filed on Jun. 16, 1997.

(51) Int. Cl.[7] .................... H01L 21/00; H01L 29/76; H01L 29/94
(52) U.S. Cl. .................. 257/303; 257/313; 257/630; 438/158; 438/253; 438/396
(58) Field of Search ................... 438/238, 239, 438/574, 578, 579, 582, 583, 592, 593, 652, 653, 655, 657, 658

(56) References Cited

U.S. PATENT DOCUMENTS

| 5,108,951 A | 4/1992 | Chen et al. ............... 437/187 |
| 5,162,884 A | * 11/1992 | Liou et al. ................ 257/384 |
| 5,304,504 A | * 4/1994 | Wei et al. .................. 437/44 |
| 5,309,026 A | 5/1994 | Matsumoto .............. 257/787 |
| 5,382,340 A | 1/1995 | Kola et al. ............. 204/192.13 |
| 5,395,790 A | 3/1995 | Lur ............................ 437/69 |
| 5,480,529 A | 1/1996 | Kola et al. ............. 204/298.03 |
| 5,502,320 A | 3/1996 | Yamada ..................... 257/302 |

OTHER PUBLICATIONS

Chen et al., "The stress Intensity Factors of Slighty Undulating Interface Cracks of Bimaterials," International Journal of Fracture 80: 277–293, 1996.
S. M. Hu, "Film–edge–induced Stress in Silicon Substrates," Appl. Phys Lett. 32(1), Jan. 1, 1978, pp 5–7.
Vanhellemont et al., "Film–edge–induced dislocation generation in silicon substrates. II. Application of the theoretical model for local oxidation processes on (001) silicon substrates," J. Appl. Phys. 61 (6) pp. 2176–2188, Mar. 15, 1987.
Pfiester et al., "An ITLDD CMOS Process with Self–Aligned Reverse–Sequence LDD/Channel Implantation," IEEE Transactions on Electron Devices, vol. 38, No. 11, pp. 2460–2464, Nov. 1991.
Murarka, "Silicides for VLSI Applications," p. 35 (1983).

(List continued on next page.)

Primary Examiner—Matthew Smith
Assistant Examiner—Calvin Lee
(74) Attorney, Agent, or Firm—Lawrence J. Bassuk; W. James Brady; Frederick J. Telecky, Jr.

(57) ABSTRACT

The stress at the edges of a thin film conductor can be reduced by noncoincident layered structures, which takes advantage of the characteristic stress polarity changing from tensile to compressive or vice versa in the edge vicinity in order to avoid device reliability and performance problems. By using noncoincident layered structures, destructive stress interference from different layers can be achieved to reduce the stress or stress gradient at the edge. The structures and methods disclosed herein can advantageously be used in many integrated circuit and device manufacturing applications (including gates, wordlines, and bitlines).

11 Claims, 3 Drawing Sheets

OTHER PUBLICATIONS

D. S. Wen et al., "A Self–Aligned Inverse–T Gate Fully Overlapped LDD Device for Sub–Half Micron CMOS," *Technical Digest, Int'l Electron Devices Meeting*, paper 32.1 (IEEE, 1989).

Goranova et al., "A Pragmatic View of Inverse–T–Gate Lightly–Doped–Drain Transistors," *Solid–State Electronics*, vol. 34 (Pergamon Press, 1991), pp. 1169–1173.

Chen et al., "Self–Aligned Silicided Inverse–T Gate LDD Devices for Sub–Half Micron CMOS Technology," *Technical Digest, Int'l Electron Devices Meeting*, paper 33.4 (IEEE, 1990).

Wen et al., A Self–Aligned Inverse–T Gate Fully Overlapped LDD Device for Sub–Half Micron CMOS, *Technical Digest, Int'l Electron Devices Meeting*, paper 32.1 (IEEE, 1989).

Goranova et al., "A Pragmatic View of Inverse–T–Gate Lightly–Doped–Drain Transistors", *Solid–State Electronics*, vol. 34 (Pergamon Press, 1991), pp. 1169–1173.

Chen et al., "Self–Aligned Silicided Inverse–T Gate LDD Devices For Sub–Half Micron CMOS Technology", *Technical Digest, Int'l Electron Devices Meeting*, paper 33.4 (IEEE, 1990).

\* cited by examiner

EDGE STRESS REDUCTION BY NONCOINCIDENT LAYERS

This application claims benefit to U.S. application Ser. No. 60/049,765, filed Jun. 16, 1997.

BACKGROUND AND SUMMARY OF THE INVENTION

The present invention relates to edge stress reduction in integrated circuit structures and fabrication methods.

Background: Stress-Induced Defects

Nearly all films are found to be in a state of internal stress, regardless of the means by which they have been produced. The stress may be compressive or tensile. Compressively stressed films are characterized by the fact that they would like to expand parallel to the substrate surface, and in the extreme, a compressively stressed film will buckle up on the substrate (the stress in the substrate is opposite in sign). Films in tensile stress, on the other hand, would like to contract parallel to the substrate, and may crack if their elastic limits are exceeded. Films in tensile stress tend to cause concave bending of the substrate (bending toward the film), while films in compressive stress tend to cause convex bending (bending away from the film).

For example, during the formation of silicides, there is a net volume shrinkage which could possibly result in a large tensile stress in the film. This stress can result in delamination and other problems during subsequent processing.

Highly stressed films are undesirable as they are more likely to exhibit poor adhesion, they are more susceptible to corrosion, they may undergo cracking in tensile stress (especially for brittle films, such as inorganic dielectrics), and they tend to exhibit higher resistivities. In addition, the stress increases with increasing thickness.

One conventional approach of reducing the stress in metal films (e.g. tungsten), which is discussed in U.S. Pat. No. 5,480,529 to Kola et al., includes employing a continuously operating capacitance- based measurement technique to allow adjustment of the deposition conditions in rapid response to changes in the stress of the film being deposited. However, this approach requires frequent and rapid measurements and constant adjustment of process parameters, both of which are cumbersome and increase the cost of the devices. Not all processes can be optimized in this way and not all films can be made stress-free (especially refractory metals and silicides).

A stressed film will tend to cause a corresponding stress in the layer(s) to which it is bonded. For example, a transistor gate layer which is in strong compressive stress will tend to induce a tensile stress in a substrate to which it is bonded.

Particularly large stresses and gradients occur at the edges of layered device structures such as gate edges, nitride moat (e.g. active device area) mask edges, and LOCOS edges. The stress level often reaches hundreds of Mega-Pascals at tens of nanometers within the vicinity of the edge. This stress level can cause structural reliability problems, such as peeling, or induce crystal defects in silicon during device processing. Furthermore, stress-induced defects can undesirably increase the leakage current in transistors.

Background: DRAM Gate Structures

One of the driving forces in shrinking integrated circuit geometries is the distributed resistance and parasitic capacitance of the signal lines, which reduce the propagation speed of signals. The additional delays thus introduced reduce the potential speed of the chip.

This is a particular problem for DRAMs, since the word-lines are densely packed together, and the capacitive coupling between adjacent lines becomes very significant. Moreover, the sheet resistance of the lines cannot usefully be improved by increasing the height of the lines, since this also increases the capacitive coupling between adjacent lines. There has therefore been great pressure to find materials with a lower resistivity to replace the traditional polysilicon/silicide lines. This has impelled efforts to design metal into the gate line structure. One example of this is a gate stack structure which includes tungsten (or other refractory metal) over polysilicon with a diffusion barrier layer therebetween (e.g. 5 nm of TiN), but many other gate stack structures have been proposed.

Stress in the refractory metal and barrier layers is typically tensile and very high (e.g. between 1000 and 3000 MPa), while the stress in the polysilicon and gate oxide is compressive and much lower (e.g. 100 to 300 MPa). (Thus, the tensile stress of the metal layer dominates over the compressive stress of the polysilicon layer.) The stress distribution in the silicon substrate near the gate structure is tensile at external edges, and rapidly changes to compressive toward the center of the gate. This polar reversal of layer stresses occurs within tens of nanometers. The interaction of stress and point defects in the silicon substrate (due to ion implantation or grown in micro-defects) during annealing can undesirably cause crystal dislocations.

Background: Inverse-T-Gates

Inverse-T-gate structures are usually formed by forming sidewall spacers on an upper polysilicon layer portion prior to etching the lower polysilicon layer portion (and possibly an intervening barrier layer). Thus in a single patterning step this produces a conductor line in which the upper portion is narrower than the lower portion. (However, inverse-T-gate structures do not normally contain a thick, highly-stressed metal layer, and are usually designed to control profiling of the implanted diffusions.) Inverse-T-gate structures are discussed in, for example, the following articles: Wen et al., "A Self-Aligned Inverse-T Gate Fully Overlapped LDD Device for Sub-Half Micron CMOS," 1989 IEDM paper 32.1; Goranova et al., "A Pragmatic View of Inverse-T-Gate Lightly-Doped-Drain Transistors," 34 Solid-State Electronics 1169 (1991); and Chen et al., "Self-Aligned Silicided Inverse-T Gate LDD Devices for Sub-Half Micron CMOS Technology," 1990 IEDM, 829; all of which are hereby incorporated by reference.

Edge Stress Reduction Structures and Methods

The present application discloses structures and methods which enable the reduction of the edge stress to avoid device reliability and performance problems. In cases where the choice of materials is limited, reduction of edge stress can be achieved by noncoincident layered structures, which takes advantage of the characteristic stress polarity changing from tensile to compressive or vice versa in the edge vicinity. By using noncoincident layered structures, destructive stress interference from different layers can be achieved to reduce the stress or stress gradient at the edge. The structures and methods disclosed herein can advantageously be used in many integrated circuit and device manufacturing applications (including gates, wordlines, and bitlines).

Advantages of the disclosed methods and structures include:

optimization of the stress at the edge to reduce or eliminate device reliability and/or performance problems; and can be implemented in any integrated circuit device to reduce stress at the edges.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview of Methods and Structures

As shown in FIGS. 2A–2D, a typical stack structure typically consists of the following layers: dielectric 240, metal 230, diffusion barrier 220, conductive layer (e.g., polysilicon) 210, and gate dielectric 200.

Figure 1:
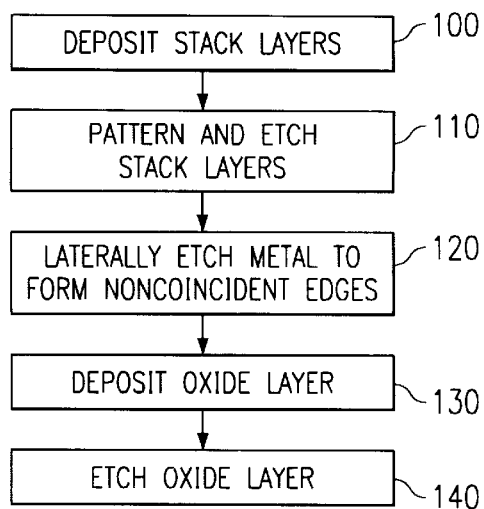
FIG. 1 shows a process flow for fabricating a DRAM gate structure using embodiments of the present invention.
Figure 2A:
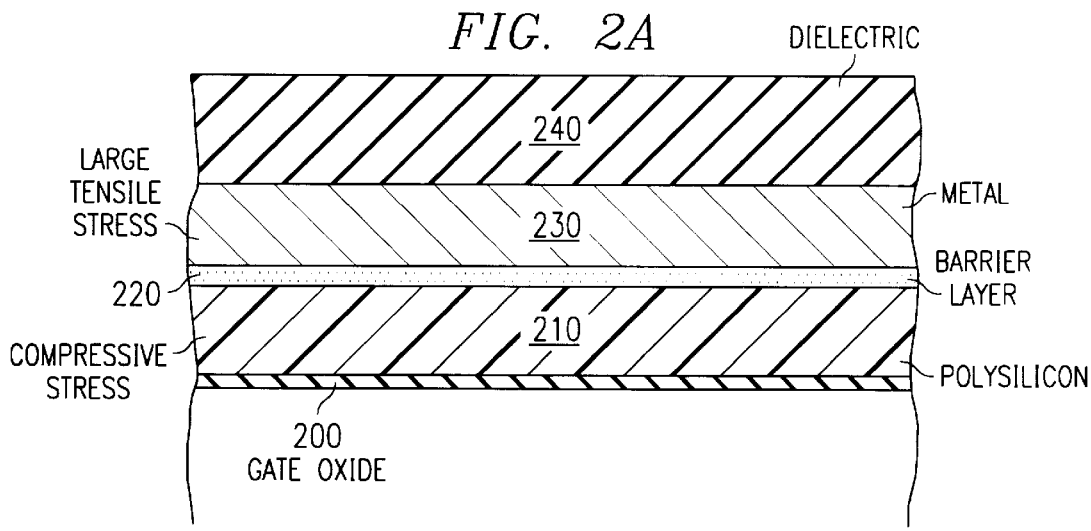
FIGS. 2A–2E schematically illustrate the formation of DRAM gate structures in accordance with embodiments of the present invention.
Figure 2B:
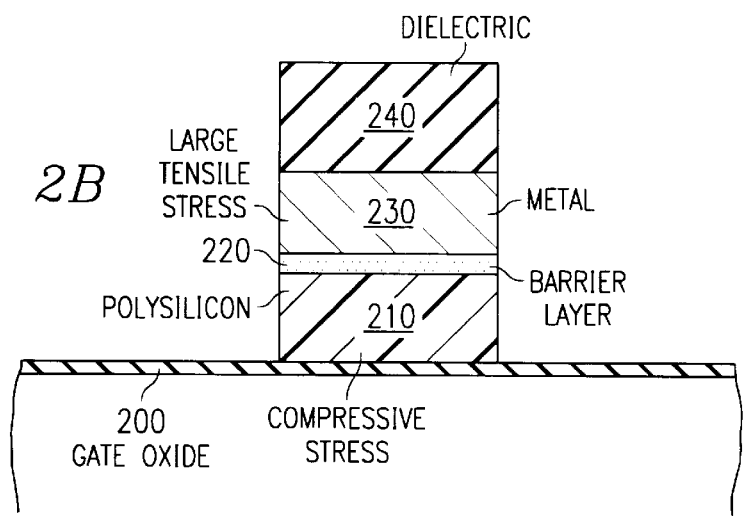

To reduce stress at the edge, and thus of the total structure, a noncoincident structure is fabricated in accordance with the process flow of FIG. 1. First, the gate stack layers are blanket deposited (step 100): conductive layer 210, barrier layer 220, metal 230, and a dielectric layer 240, as shown in FIG. 2A. Thereafter, the stack is formed by patterning, using a photoresist, and etching (step 110) the stack layers 210, 220, 230, and 240, which is illustrated in FIG. 2B.

Figure 2C:
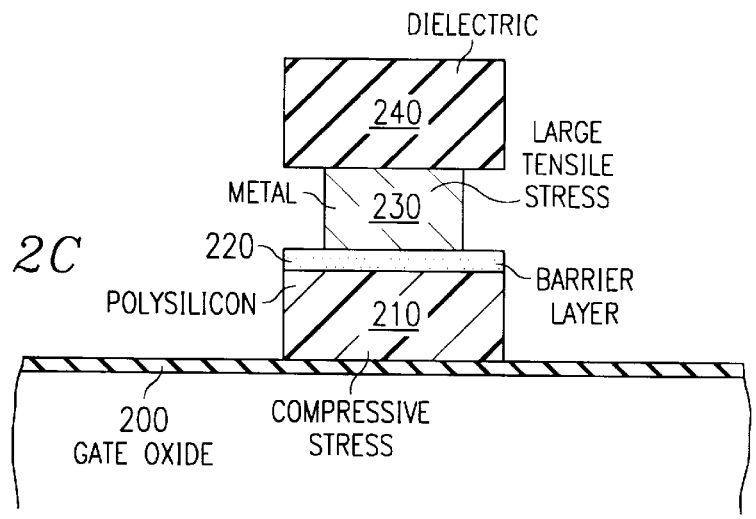

In order to reduce the edge stress, the metal layer 230 is then made noncoincident, by performing a lateral etch (step 120) of the metal 230, which results in the structure shown in FIG. 2C.

Figure 2D:
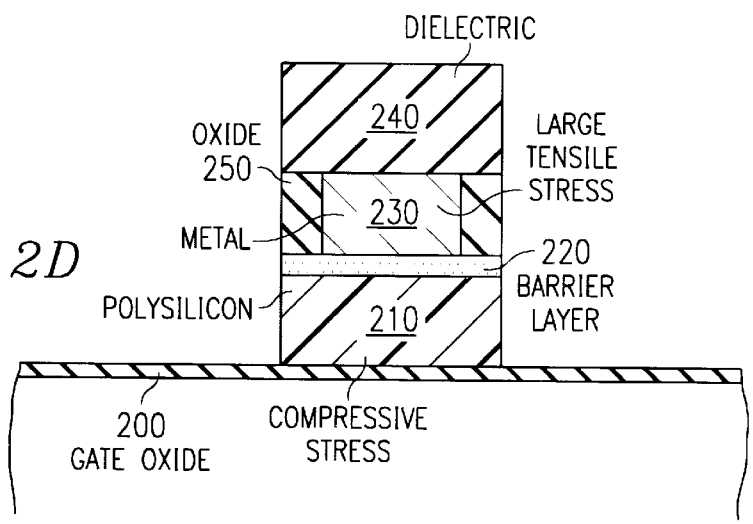

Subsequently, a dielectric layer 250 is deposited (step 130) overall to fill the space on either side of the metal layer 230, and then etched (step 140) to form the structure shown in FIG. 2D.

First Noncoincident Layered Embodiment: Gate Structure

In this presently preferred embodiment, a complicated DRAM transistor gate stacks is shown, consisting of the following layers: silicon nitride 240, tungsten 230, titanium nitride 220, polysilicon 210, and gate oxide 200. This gate stack has potential application in 256 Megabit and higher DRAM products which require low resistance wordlines. The thickness of the materials for a typical 256 Megabit gate stack are: silicon nitride 150 nm, tungsten 60 nm, titanium nitride 20 nm, polysilicon 50 nm, and gate silicon dioxide 5 nm.

After blanket deposition of each of the above layers, the gate stack is patterned and etched. The nitride layer 240 is typically etched using a CHF3 and CF4 chemistry, while the tungsten layer can be etched selective to TiN using a SF6 chemistry. The TiN is then anisotropically etched using a BCl3 and Cl2 chemistry, followed by the etching of the polysilicon layer with HBr and Cl2.

Tungsten layer 230 is then made noncoincident, by performing a subsequent lateral etch using, for example, SF6. The amount of lateral etch of the tungsten layer 230 is typically at least 0.8 of the height of the polysilicon layer 210, while the width of the tungsten layer 230 is 0.4 to 0.8 (preferably 0.45 to 0.6) of the width of the polysilicon layer 210.

Silicon oxide layer 250 is deposited overall, filling the space on either side of the tungsten layer 230, and then etched to form the gate structure. Processing then continues with conventional steps to complete fabrication, e.g. oxidation, deposition and planarization of further interlevel dielectric, via patterning, second metal deposition and etch, protective overcoat deposition, etching contact pad apertures, etc.

The nitride/tungsten/barrier layer stresses are highly tensile (1000–3000 MPa) as compared with the compressively stressed polysilicon and gate oxide layers (100–300 MPa). Therefore, the stress of the tensile layers dominates the compressively stressed layers. By using a noncoincident metal layered structure, destructive interference between the high-stress tensile tungsten and titanium nitride layers can be achieved to reduce the stress or stress gradient at the edge.

Figure 3:
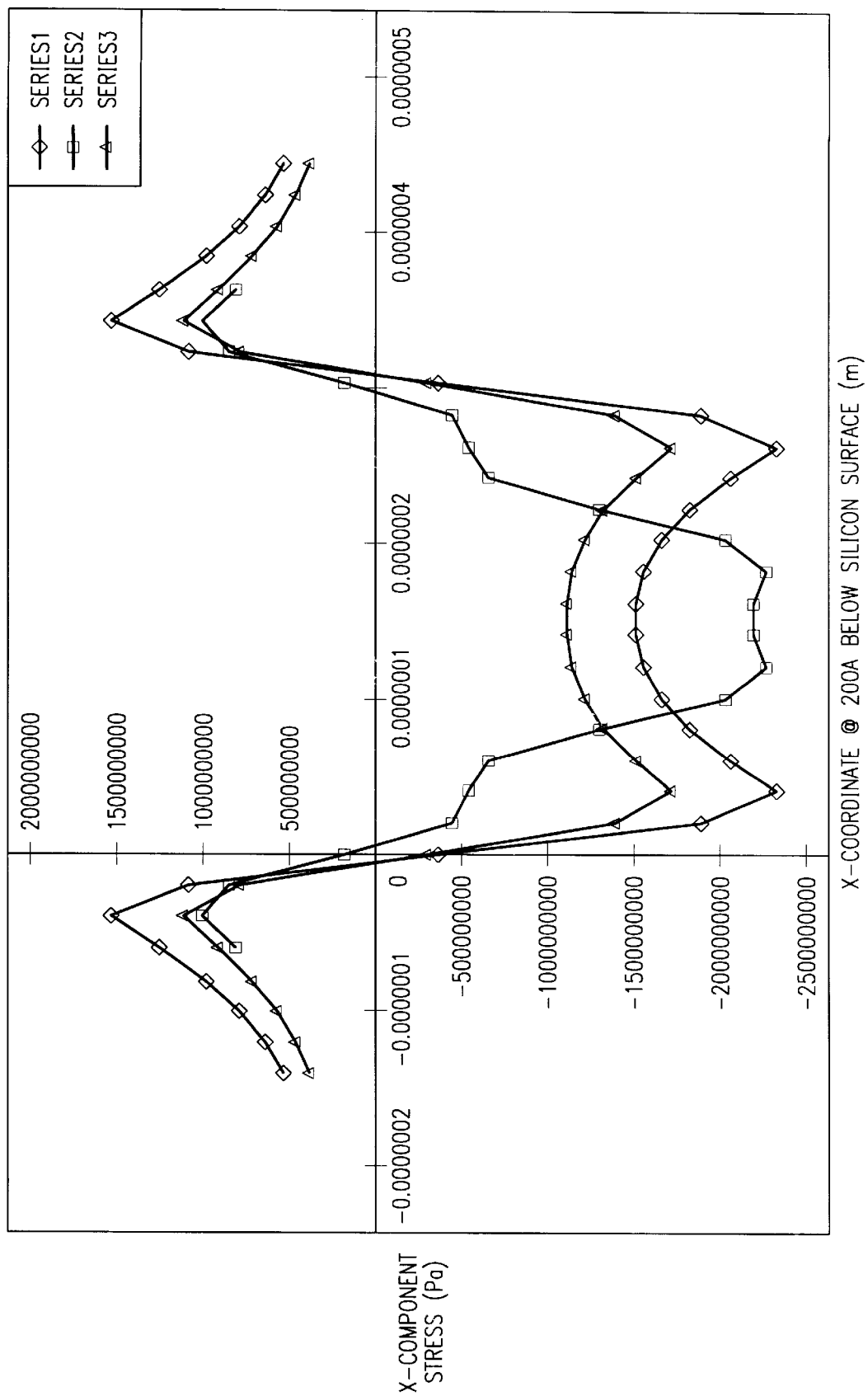
FIG. 3 is a chart showing the change in stress in various structures.

A first-order estimate of the stress distribution for three different structures containing layers of tungsten and TiN using measurements taken in the substrate from 40 nm outside the gate stack to 40 nm underneath the gate stack is illustrated in the chart in FIG. 3. Both the tungsten and the TiN have a similar tensile stress magnitude of 1000 MPa. The first structure (series 1) had a layer of tungsten overlying a layer of TiN, in which both layers were of equal width. The width of both the tungsten and the TiN layers was 0.1 microns each. The second structure (series 2) had a noncoincident structure similar to the structure described herein, in which the tungsten layer had a width smaller than the TiN layer. The third structure (series 3) had both tungsten and TiN of the same width, but the total thickness was reduced to 0.147 microns, so that the cross-sectional area was equal to the second structure. As can be seen from FIG. 3, the change in stress per unit length at the edge of the gate structure is predicted to decrease for the noncoincident structure (series 2).

The following table shows the absolute value of the change in stress (Delta Stress) in Pascals between measurements taken in the substrate 40 nm outside the gate stack and 40 nm underneath the gate stack for the three different structures.

| Stress Distribution | 40 nm outside film | 40 nm underneath film | Delta Stress |
| --- | --- | --- | --- |
| Series 1 | 1.53E9 | −2.32E9 | 3.85E9 |
| Series 2 | 1.00E9 | −0.54E9 | 1.54E9 |
| Series 3 | 1.12E9 | −1.70E9 | 2.82E9 |

Series 2 has the minimum delta stress at +−40 nm from the film edge. Therefore, by using noncoincident structures, the gate stack stress at the edge can be significantly reduced.

Alternative Noncoincident Structure Formation Embodiment: Overetch Tungsten

Alternatively, the noncoincident tungsten layer 230 can be formed by overetching the tungsten layer 230 (using SF6, which is selective to TiN) during the gate stack formation. Advantageously, a subsequent etch of the tungsten layer 230 does not need to be performed.

Alternative Dielectric Layer Embodiment: Silicon Dioxide

Alternatively, a layer of silicon dioxide can be deposited over the tungsten layer prior to the gate stack etch and the formation of the noncoincident tungsten.

Alternative Dielectric Layer Embodiment: Silicon Oxynitride

Alternatively, a layer of silicon oxynitride can be deposited over the tungsten layer prior to the gate stack etch and the formation of the noncoincident tungsten.

Alternative Barrier Layer Embodiment: TiAlN

Alternatively, a layer of TiAlN can be deposited over the polysilicon layer prior to the deposition of the metal layer to serve as a barrier layer.

Alternative Barrier Layer Embodiment: TiSiN

Alternatively, a layer of TiSiN can be deposited over the polysilicon layer prior to the deposition of the metal layer to serve as a barrier layer.

Alternative Barrier Layer Embodiment: Tungsten Nitride

Alternatively, a layer of tungsten nitride can be deposited over the polysilicon layer prior to the deposition of the metal layer to serve as a barrier layer.

Alternative Barrier Layer Embodiment: Titanium Boride

Alternatively, a layer of titanium boride can be deposited over the polysilicon layer prior to the deposition of the metal layer to serve as a barrier layer. Advantageously, titanium boride has a resistivity close to the resistivity of tungsten, and therefore the titanium boride layer can be made nearly as thick as the tungsten layer in order to increase the destructive interference between the tungsten and titanium boride layers, and thus reduce the edge stress. Further information on titanium boride can be found in: Murarka, Silicides for VLSI Applications, p.35 (1983), which is hereby incorporated by reference.

Alternative Barrier Layer Embodiment: Hafnium Boride

Alternatively, a layer of hafnium boride can be deposited over the polysilicon layer prior to the deposition of the metal layer to serve as a barrier layer. Advantageously, hafnium boride has a resistivity close to the resistivity of tungsten, and therefore the boride layer can be made nearly as thick as the tungsten layer in order to increase the destructive interference between the tungsten and boride layers, and thus reduce the edge stress.

Alternative Barrier Layer Embodiment: Zirconium Boride

Alternatively, a layer of zirconium boride can be deposited over the polysilicon layer prior to the deposition of the metal layer to serve as a barrier layer. Advantageously, zirconium boride has a resistivity close to the resistivity of tungsten, and therefore the boride layer can be made nearly as thick as the tungsten layer in order to increase the destructive interference between the tungsten and boride layers, and thus reduce the edge stress.

Alternative Metal Layer Embodiment: Molybdenum

The present invention is not limited to tungsten, but can be applied to other refractory metals. In an alternative contemplated class of embodiments, the metal layer can be molybdenum or a molybdenum alloy, and the process described above can be used to reduce the stress at the gate edges.

Alternative Metal Layer Embodiment: Platinum

In another alternative contemplated class of embodiments, the metal layer can be platinum or an alloy thereof, and the process described above can be used to reduce the stress at the gate edges.

Alternative Metal Layer Embodiment: Tantalum

In another alternative contemplated class of embodiments, the metal layer can be tantalum or an alloy thereof, and the process described above can be used to reduce the stress at the gate edges.

Alternative Metal Layer Embodiment: Niobium

In another alternative contemplated class of embodiments, the metal layer can be niobium or an alloy thereof, and the process described above can be used to reduce the stress at the gate edges.

Alternative Gate Stack Embodiment: Metal Silicide

In an alternative embodiment, a metal silicide layer (e.g. titanium silicide), which has a thickness of around 80 nm, can be deposited over the polysilicon layer instead of the metal layer. Titanium silicide (TiSi2) is typically used because it has a significantly lower sheet resistance than other commonly used metal silicides, such as tungsten silicide. Titanium silicide films typically have large tensile stress, and therefore a noncoincident TiSi2 layer can be formed using embodiments of the present invention in order to reduce the edge stress.

Alternative Metal Silicide Layer Embodiment: Molybdenum Silicide

In alternative embodiments, the metal silicide layer can consist of molybdenum silicide. Otherwise, processing conditions are similar to those for titanium silicide.

Alternative Metal Silicide Layer Embodiment: Cobalt Silicide

In alternative embodiments, the metal silicide layer can consist of cobalt silicide. Otherwise, processing conditions are similar to those for titanium silicide.

Second Noncoincident Layered Embodiment: Bitlines

In DRAMs, the bitline metallization typically includes a barrier/adhesion layer (e.g. titanium) underlying a highly-stressed metal layer, such as tungsten, and an overlying dielectric (e.g. TEOS, or silicon nitride, which has tensile stress). The stress at the edge of bitline structures can be reduced by forming a noncoincident metal layer in accordance with embodiments of the present invention.

Third Embodiment: Multiple Noncoincident Layers

Figure 2E:
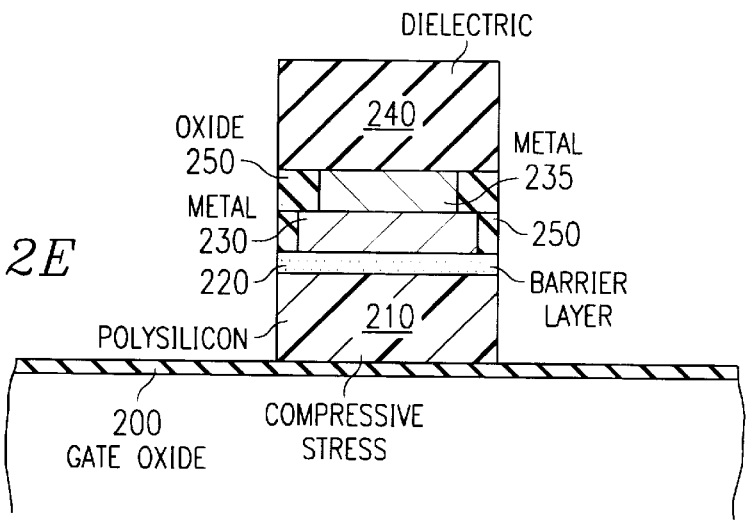

As shown in FIG. 2E, multiple noncoincident layers can be formed to further reduce edge stress, by providing metal layer 235, shown deposited over tungsten layer 230. Where both metal layers are the same (e.g., tungsten), an etch stop layer (not shown) is interposed between layers 230 and 235. After layer 235 is etched, but before layer 230 is exposed, a lateral etch of layer 235 is performed. This is followed by etching of the remaining stack layers and a second lateral etch to undercut layer 230. Alternatively, where metal layer 235 is of a different metal from layer 230, a single etch step can be used, with an etchant having selective etch rates for the two metals.

According to another disclosed class of innovative embodiments, there is provided: An integrated circuit structure, comprising: a highly-stressed metal overlying a second conductive material, which has a thickness greater than half of the thickness of said metal; wherein the width of said metal is less than the width of said second conductive material; wherein destructive interference between said second conductive layer and said metal lowers the stress in underlying structures near edges of said structure.

According to another disclosed class of innovative embodiments, there is provided: A method of fabricating an interconnect structure, comprising the steps of: (a.) patterning and etching an interconnect structure having at least a highly-stressed metal layer and a layer of a second conductive material; (b.) selectively laterally etching said metal layer to form edges of said metal layer which are not coincident with edges of said second conductive material; (c.) depositing a blanket dielectric layer; and (d.) etching said dielectric layer to leave said dielectric layer only in areas within said interconnect structure adjacent to said metal layer; wherein destructive interference between said second conductive layer and said metal lowers the stress in underlying structures near edges of said interconnect structure.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

While the inventions have been described with primary reference to a single-poly process, it will be readily recognized that these inventions can also be applied to process with two, three, or more layers of polysilicon or polycide. Furthermore, it should be noted that the inventions described herein can be applied to gate stacks having only a metal layer and no polysilicon layer, in which the edges of the top portion of the metal layer are noncoincident to the edges of the bottom portion of the metal layer.

It should also be noted that the number of layers of metallization described above does not implicitly limit any of the claims, which can be applied to processes and structures with more or fewer layers.

Of course a variety of structures can be used to implement the polysilicon or polycide gate. Similarly, a wide variety of materials, and of combinations of materials, can be used to implement the metal layer.

Of course, the specific etch chemistries, layer compositions, and layer thicknesses given are merely illustrative, and do not by any means delimit the scope of the claimed inventions.

The invention can also be adapted to other combinations of dielectric materials in the interlevel dielectric. For example, phosphosilicates, germanosilicate, borophosphosilicate, arsenosilicates or combinations thereof, in addition to low-k dielectrics and spin-on-glass can be used instead of the SiO2 of the presently preferred embodiment.

What is claimed is:

1. An integrated circuit structure, comprising:
   a. a substrate having a top surface;
   b. a bottom conductor that is elongate with a substantially rectangular cross-section that presents a longitudinal center axis, two opposed sidewalls spaced apart a certain distance, a bottom wall and a top wall, the bottom wall being arranged adjacent the top surface of the substrate;
   c. a top conductor that is elongate with a substantially rectangular cross-section that presents a longitudinal center axis, two opposed sidewalls, a bottom wall and a top wall, the bottom wall of the top conductor being arranged over the top wall of the bottom conductor, the longitudinal axis of the top conductor being arranged substantially aligned with the longitudinal axis of the bottom conductor, and the sidewalls of the top conductor being spaced apart a distance less than the certain distance between the sidewalls of the bottom conductor;
   d. the top wall of the bottom conductor and the sidewalls of the top conductor being free of any sidewall spacers; and
   e. the lead width of the top conductor being at least 0.8 times the height of the bottom conductor, and the lead width of the top conductor being within the range of 0.4 to 0.8 times the lead width of the bottom conductor.

2. The integrated circuit structure of claim 1, in which the substrate includes silicon.

3. The integrated circuit structure of claim 1, in which the bottom conductor includes material of compressive stress.

4. The integrated circuit structure of claim 1, in which the top conductor includes material of tensile stress.

5. The integrated circuit structure of claim 1, in which the bottom conductor is polysilicon.

6. The integrated circuit structure of claim 1, in which the top conductor includes refractive metal.

7. The integrated circuit structure of claim 1, in which a barrier layer is arranged in between the top and the bottom conductors.

8. The integrated circuit structure of claim 7, in which the barrier layer includes titanium nitride.

9. The integrated circuit structure of claim 7, in which the barrier layer includes titanium boride.

10. The integrated circuit structure of claim 1, in which a dielectric layer is arranged adjacent to the top wall of the top conductor.

11. The integrated circuit structure of claim 10, in which the dielectric layer includes an antireflection coating.

\* \* \* \* \*